(12) United States Patent
Albinsson et al.

(10) Patent No.: US 6,348,844 B1
(45) Date of Patent: Feb. 19, 2002

(54) TRANSITION BETWEEN SYMMETRIC STRIPLINE AND ASYMMETRIC STRIPLINE

(75) Inventors: Björn Albinsson, Göteborg; Thomas Harju, Sävedalen, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/594,771

(22) Filed: Jun. 16, 2000

(30) Foreign Application Priority Data

Jun. 17, 1999 (SE) .............................................. 9902302

(51) Int. Cl.$^7$ ................................................. H01P 5/08
(52) U.S. Cl. ........................ 333/33; 333/246; 333/260
(58) Field of Search ................................ 174/261, 255; 361/792; 333/246, 33, 204, 219, 34, 260

(56) References Cited

U.S. PATENT DOCUMENTS 5,373,187 A * 12/1994 Sugino et al. .......... 333/246 X

FOREIGN PATENT DOCUMENTS

EP 0 563 873 A2 10/1993
JP 6334449 A 12/1994

* cited by examiner

Primary Examiner—Justin P. Bettendorf
Assistant Examiner—Stephen E. Jones
(74) Attorney, Agent, or Firm—Burns, Doane, Swecker & Mathis, L.L.P.

(57) ABSTRACT

The present invention relates to an arrangement in multilayer printed circuit boards, with the aim of improving matching in transitions between symmetric striplines (3) and asymmetric striplines (4). The requirement of a coverpad (6) for contact between the via (5) and the asymmetric stripline (4) for dimension reasons among other things, results in matching problems. In order to avoid this problem, the earth plane (7, 10) nearest the transition is moved away in the proximity of the via (5).

8 Claims, 2 Drawing Sheets

TRANSITION BETWEEN SYMMETRIC STRIPLINE AND ASYMMETRIC STRIPLINE

This application claims priority under 35 U.S.C. §§119 and/or 365 to 9902302-1 filed in Sweden on Jun. 17. 1999; the entire content of which is hereby incorporated by reference.

FIELD OF INVENTION

The present invention relates to multilayer printed circuit boards, and more specifically to a transition between symmetric and asymmetric striplines in such boards.

BACKGROUND OF THE INVENTION

Many different sorts of multilayer printed circuit boards are known to the art. LTCC (Low Temperature Co-fired Ceramic) will be used hereinafter as an example, although it will be understood that the invention can also be applied in other types of multilayer printed circuit boards.

Briefly, multilayer printed circuit boards are manufactured in the following way. There is obtained on the basis of a printed circuit board design a drawing that contains necessary information, such as the number of layers, the appearance and dimensions of the patterns on the various layers, the locations at which different layers shall contact one another, and so on.

Each layer per se is rolled out from a ceramic mass to a predetermined thickness on a plastic film; this is a so-called tape. Different patterns are punched from these tapes in accordance with the design; among other things, the outer edges of the board, the marks that are later used to match the layers together, and holes for binding different layers together with so-called vias.

Subsequent to configuring the layers, the via holes are filled with a suitable conductive material. The patterns are then printed on each of the layers. A common method in this respect is to use screen printing to correctly position the conductors. These conductors may consist of gold, silver or some other suitable conductive material. When the patterns are in place, the various layers are placed one upon the other until all layers are in position.

The whole of the printed circuit board is then placed under pressure, inserted into an oven and baked immediately (Co-fired) at a relatively low temperature, 700–800 degrees centigrade (Low Temperature), wherewith the ceramic mass is sintered and transformed to a ceramic. Subsequent to this curing or hardening process, it is usual to speak of layers instead of tapes.

In the case of applications for high frequency signals, particularly within the microwave field, it is not always possible to use traditional conductors, since this would result in unacceptable losses and disturbances. A normal requirement in the case of microwave signals is the presence of an earth plane above or beneath a conductor, this earth plane following the conductor. When a conductor only has an earth plane on one side it is called a microstrip. These strips are normally arranged so that they have the printed circuit board on one side and air or a corresponding dielectric on the other side. In other cases, it is desirable that the conductor is surrounded by both an upper and a lower earth plane, this conductor then being called a stripline. When the distances between a stripline and the earth planes are the same on both sides of the conductor, it is said that the stripline is symmetrical. When these distances are mutually different, the stripline is said to be asymmetrical.

Although symmetric striplines are the most common, there are occasions when an asymmetric stripline is preferred; for instance, the performance of a transition becomes poorer the greater the distance between the two striplines. Consequently, a transition between an asymmetric stripline close to an earth plane to an asymmetric stripline that is close to the other side of the earth plane may be more effective than a transition between two symmetric striplines. The transition between symmetric and asymmetric striplines is sometimes made between the same earth planes, which, in principle, is what is shown in FIG. 1.

One advantage afforded by striplines is that radiation from the conductors is small when, e.g., transmitting signals in the microwave range in so-called stripline-mode, which is one reason why such signals are often transmitted in this way. Microstrips and striplines can be easily provided in multilayer printed circuit boards, and are consequently often used to this end. In order to enable conductors to be surrounded by earth planes, conductor planes and earth planes are normally disposed alternately in the printed circuit board.

It is necessary to follow special construction rules in the production of multilayer printed circuit boards. For instance, in order to satisfy the rules a given smallest tape thickness is required for a smallest conductor width of a 50-ohm conductor. The rules also require the diameter of the vias to be in the same order of magnitude as the thickness of the tape. Consequently, in the case of the transition shown in FIG. 1, the diameter of the via is greater than the width of the asymmetric stripline. In order to compensate for this and to ensure only a small margin of error so that the via will safely meet the conductor, it is normal to place a cover pad on one end of the conductor; see FIG. 2. The presence of the cover pad results in a mismatch between the via and the conductor.

Mismatch problems do not actually occur in the case of low frequency signals. Mismatch, however, is a problem in the case of RF signals, for instance. Because it is otherwise usual to conduct RF signals in a so-called stripline mode, which reduces radiation from the conductors, it is desirable to solve problems associated with mismatching.

SUMMARY OF THE INVENTION

The present invention addresses the problem of improving matching in the transition between a symmetric and an asymmetric stripline.

Accordingly, one object of the present invention is to provide a transition between symmetric and asymmetric striplines that results in good matching.

In brief, the present invention provides an arrangement with a transition between a symmetric an asymmetric stripline in which the earth plane closest to the transition is moved away through the distance of one level in the proximity of the via.

The invention arrangement is characterised by the features set forth in the accompanying claim 1.

Advantageous embodiments of the inventive method will be evident from the dependent claims 2–8.

One advantage with this solution to the problem is that transitions between symmetric and asymmetric striplines can be made with better matching, meaning that the printed circuit board will perform better and have less losses.

The invention will now be described in more detail with reference to preferred embodiments thereof and also with reference to the accompanying drawing.

DESCRIPTION OF PREFERRED EMBODIMENTS

Figure 1:
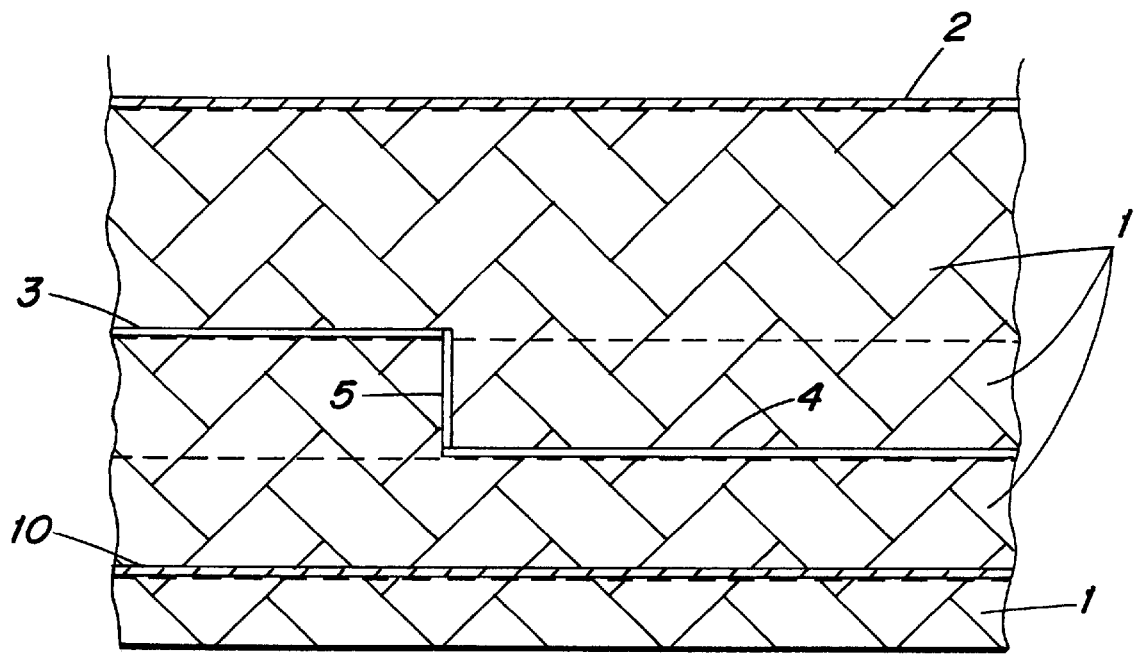
FIG. 1 is a cut-away view of a multilayer printed circuit board and shows a conventional transition between a symmetric and an asymmetric stripline.

FIG. 1 is a cut-away view of a multilayer printed circuit board having a transition between a symmetric and an asymmetric stripline. Reference numeral 1 identifies a number of mutually stacked carrier elements, layers. The layers 1 are shown separated by broken lines, in order to illustrate their vertical extension. It will be seen that the layers 1 have different thicknesses. The board may also include more layers 1 than those illustrated in FIG. 1, in which only those layers necessary for an understanding of the invention have been shown.

A conductor of some kind normally lies on at least part of each layer 1. These conductors may be earth planes 2, 10, symmetric striplines 3 and asymmetric striplines 4. Normally, two earth planes 2, 10 are placed on respective sides of a stripline 3, 4. Although FIG. 1 shows only one pair of earth planes 2, 10, the earth planes will often be more in number.

As earlier mentioned, a stripline 3 is said to be symmetrical when the distances to the nearest surrounding earth layers 2, 10 are mutually the same. On the other hand, the stripline 4 is said to be asymmetric when these distances are different. A so-called via 5 is required to interconnect two striplines in different layers, for instance to connect a symmetric stripline 3 withy an asymmetric stripline 4. The via 5 extends through at least one layer and connects at each end to a stripline 3, 4.

However, the construction rules for multilayer printed circuit boards, for instance LTCC, have certain restrictions with respect to conductor width, sizes of vias 5, etc. A given smallest conductive width for, e.g., a 50-ohm conductor requires a given smallest layer thickness. As the rules also require the vias 5 to have the same size as the thickness of the layer 1, this determines, in turn, the diameter of the vias 5. This can mean that the diameter of the via 5 will be greater than the width of the asymmetric stripline 4.

Figure 2:
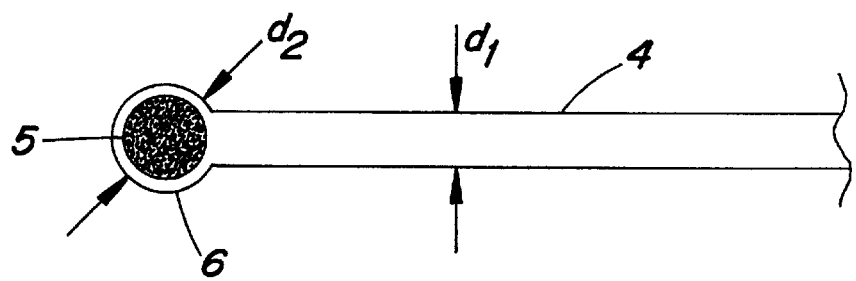
FIG. 2 shows how a conventional via meets the cover pad of a conductor, as seen from above.

FIG. 2 illustrates a method of compensating for a via diameter that is greater than the width $d_1$ of the asymmetric stripline 4, this method also providing a small error margin that will ensure that the via 5 is safely connected to the asymmetric stripline 4. One end of the asymmetric stripline 4 is provided with a so-called coverpad 6 which is placed so that the via 5 connects with the coverpad 6. When the diameter $d_2$ of the coverpad 6 is greater than the width $d_1$ of the asymmetric stripline 4, a mismatch occurs therebetween, since their impedances are different. The degree of mismatch is dependent on the quotient $q=d_1/d_2$ between the diameter $d_2$ of the cover pad 6 and the width $d_1$ of the asymmetric stripline 4. The greater this difference in size, i.e. the smaller that q is, the poorer the match in the transition between coverpad 6 and asymmetric stripline 4.

Figure 3:
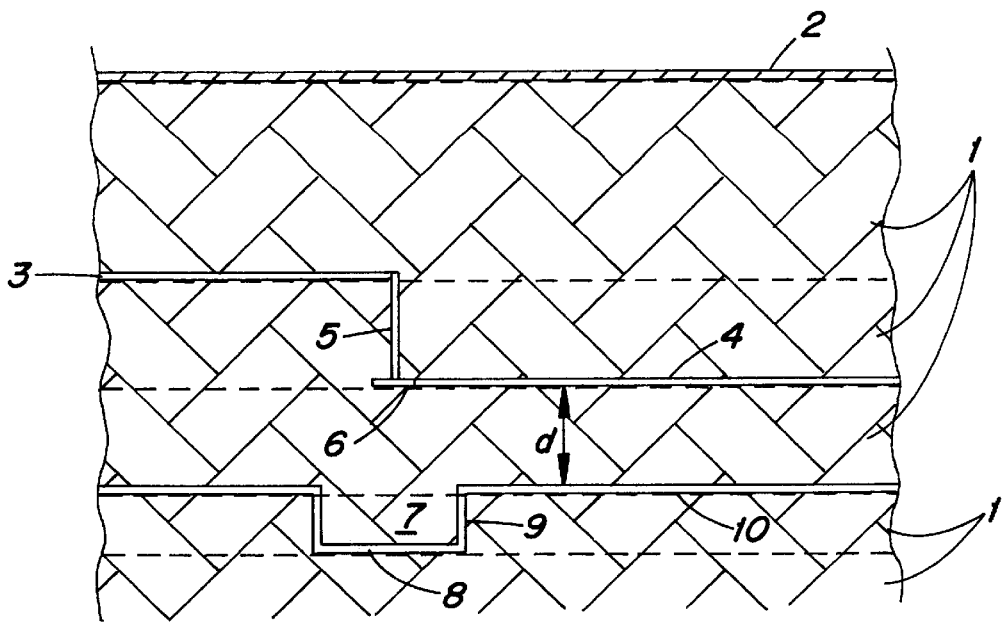
FIG. 3 is a view similar to the view of FIG. 1 showing the inventive arrangement, i.e. local movement of the earth plane in the proximity of the via and the cover pad.
Figure 4A:
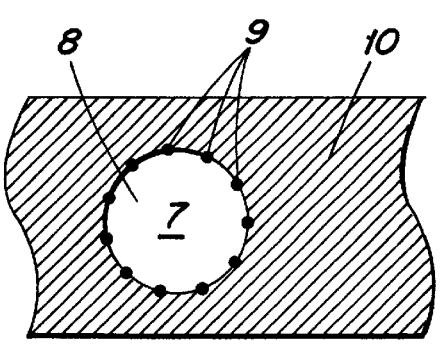
FIGS. 4A–D are cross-sectional views of some different shapes of the recessed part, according to the present invention.
Figure 4B:
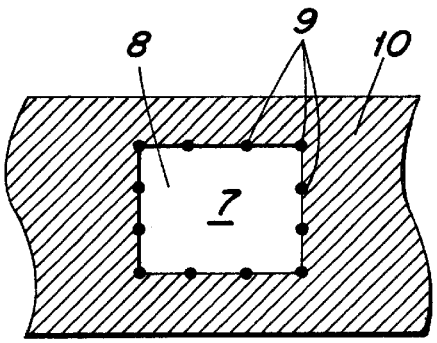
Figure 4C:
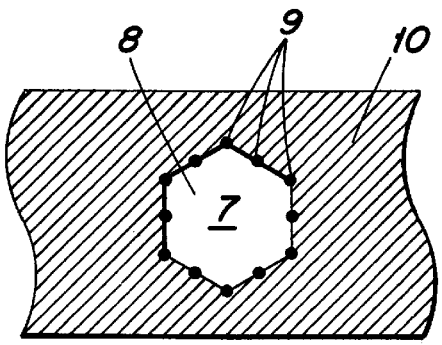
Figure 4D:
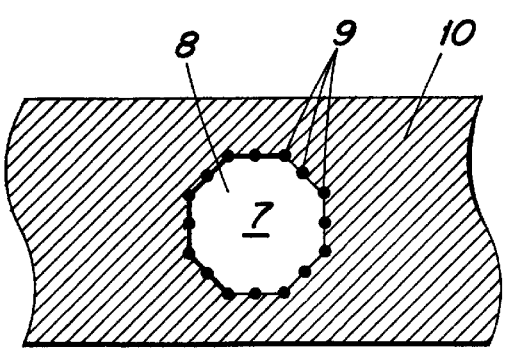

FIG. 3 is a view similar to FIG. 1 illustrating the inventive arrangement. Similar to FIG. 1, FIG. 3 illustrates a number of layers 1, these layers being one more than earlier mentioned for the reason given below. The two striplines 3, 4 and the via 5 are unchanged, with the exception that the coverpad 6 of the asymmetric stripline 4 has been shown, enlarged in comparison with FIG. 2 for the sake of illustration. The inventive arrangement involves an alteration to the earth plane 10 that is located closest to the asymmetric stripline 4. This earth plane 10 has a recessed part 7 in the vicinity of the coverpad 6.

This recessed part 7 includes a longitudinally extending recessed earth plane 8, and a number of vias 9 which connect the recessed earth plane 8 with the remainder of the lower earth plane 10. The vias 9 are generally perpendicular to both the lower earth plane 10 and the recessed earth plane 8. Because the match between cover pad 6 and asymmetric stripline 4 is improved when said pad and stripline are located at different distances from the nearest earth plane 10, this determines the construction of the recess part 7 to some extent. A general description of an optimal design cannot be given, because the construction of the recessed part 7 is dependent on the thickness of the layers 1, the line width of the conductors, the construction of the coverpad 6, the distance of the asymmetric stripline 4 from the earth plane 10 (d in FIG. 3) and the aforesaid quotient q among other things. However, some general rules will be given hereinafter. The recessed part 7 is most often centred on the centre point of the coverpad 6. Normally, it is desirable that the recessed part 7 reflects the design of the cover pad 6; for instance, when the coverpad 6 has a circular, hexagonal, octagonal or rectangular shape, the recessed part 7 will also be given a similar shape, as shown in FIGS. 4A–D. Furthermore, the distance of the coverpad 6 from the earth plane 10 can be increased both by increasing the radius or cross-dimension of the recessed part 7 and by placing the recessed earth plane 8 further away, i.e. through a distance corresponding to more than one layer. Normally, the more asymmetric the stripline 4 the greater the distance of the coverpad 6 from the recessed part 7.

Because the lower conductor plane 10 in the recessed part 7 is located further away from the coverpad 6, an improvement is achieved in the match in the transition with the via 5 from the symmetric stripline 3 to the asymmetric stripline 4. This enhances the performance of the entire construction.

It will be understood that invention is not restricted to the described and illustrated embodiments thereof, and that modifications can be made within the scope of the accompanying claims.

What is claimed is:

1. A transition between a symmetric stripline (3) and an asymmetric stripline (4) in which the via (5) between said striplines (3, 4) connects with a coverpad (6) connected to one end of the asymmetric stripline (4), characterised in that an earth plane (10), which is located nearest the asymmetric stripline (4), includes around the extension of the via (5) in a direction towards said earth plane (10), a section (7) that is located further away from the asymmetric stripline (4) than said earth plane (10) by a number of layers (1).

2. A transition according to claim 1, characterised in that said section (7) is configured so that its shape in the longitudinal direction of the layers (1) will be essentially the same as the shape of the coverpad (6) in said direction.

3. A transition according to claim 2, characterised in that the section (7) has a circular cross-section.

4. A transition according to claim 2, characterised in that the section (7) has an hexagonal cross-section.

5. A transition according to claim 2, characterised in that the section (7) has an octagonal cross-section.

6. A transition according to claim 2, characterised in that the section (7) has a rectangular cross-section.

7. A transition according to claim 1, characterised in that said section (7) includes a bottom part (8) and a number of vias (9) that extend generally perpendicularly to said bottom part (8) and which place the bottom part (8) in electrical contact with the earth plane (10).

8. A transition according to claim 1, characterised in that said section (7) is centred on the centre point of the coverpad (6).

* * * * *